United States Patent
Müller

[11] Patent Number: 5,463,364
[45] Date of Patent: Oct. 31, 1995

[54] MAGNET SYSTEM FOR NMR TOMOGRAPHY

[75] Inventor: Wolfgang Müller, Karlsruhe, Germany

[73] Assignee: Bruker Analytische Messtechnik GmbH, Rheinstetten, Germany

[21] Appl. No.: 421,072

[22] Filed: Apr. 13, 1995

[30] Foreign Application Priority Data

Apr. 13, 1994 [DE] Germany ............ 44 12 755.3
Jun. 3, 1994 [DE] Germany ............ 44 19 454.4

[51] Int. Cl.$^6$ ............... G01V 3/00; H01F 7/06
[52] U.S. Cl. ............... 335/299; 324/319; 335/296
[58] Field of Search ............... 335/216, 299, 335/301; 324/318, 319, 320

[56] References Cited

U.S. PATENT DOCUMENTS 4,613,820 9/1986 Edelstein et al.
4,710,741 12/1987 McGinley.

FOREIGN PATENT DOCUMENTS

| | | | |
|---|---|---|---|
| 0011335 | 5/1980 | European Pat. Off. | H01F 7/20 |
| 3245944 | 6/1984 | Germany | G01R 33/38 |
| 3616078 | 11/1987 | Germany | G01R 33/20 |
| 3917764 | 12/1989 | Germany | G01R 33/38 |
| 3907927 | 9/1990 | Germany | G01R 33/38 |
| 2219406 | 12/1989 | United Kingdom | G01N 24/06 |

Primary Examiner—Leo P. Picard
Assistant Examiner—Raymond M. Barrera
Attorney, Agent, or Firm—Bookstein & Kudirka

[57] ABSTRACT

A magnet system for nuclear magnetic resonance (NMR) imaging volume has two magnet coils (S1, S2) arranged on both sides of an investigational volume coaxially relative to a z axis running through the center of the investigational volume and assuming positions relative to the center of the investigational volume of $z_{S1}$ and $z_{S2}$ with average separations $r_{S1}$ and $r_{S2}$ from the z axis. During operation, currents flow through the coils in the same direction. The system is characterized by ferromagnetic rings (R11 and R21) provided for on each of the two magnet coils (S1, S2) arranged closer to the center of the investigational volume than the corresponding neighboring magnet coil (S1 or S2). The rings (R11, R21) are positioned and dimensioned in such a fashion that the magnetic field in the center of the investigational volume can be rendered homogeneous up to 8th order. The axial separation $g_S$ of both magnet coils (S1, S2) assumes a value between ¼ and ¾, preferentially ½ of the sum $r_{S1}$ and $r_{S2}$ of the average separations of both magnetic coils (S1, S2) from the z axis and the axial separation $g_R$ of both rings (R11, R21) is slightly, e.g. up to 15%, smaller than the axial separation $g_S$ between both magnet coils (S1, S2). The rings (R11, R21) are at least partially integrated into the coils. The system is compact, highly homogeneous and enjoys low power consumption while exhibiting good transverse and axial access.

20 Claims, 9 Drawing Sheets

MAGNET SYSTEM FOR NMR TOMOGRAPHY

BACKGROUND OF THE INVENTION

The invention concerns a magnet system for nuclear magnetic resonance (NMR) tomography for the production of an approximately at least 8th order homogeneous static magnetic field within an investigational volume having magnetic coils (S1, S2) which are coaxial to a z axis running through the center of the investigational volume and arranged on both sides of the investigational volume and which, relative to the center of the investigational volume (z=0), assume z positions $z_{S1}$ and $z_{S2}$ respectively, and exhibit average separations $r_{S1}$ and $r_{S2}$ respectively from the z axis and, during operation, have DC currents flowing through them in the same direction.

A magnet system of this kind is, for example, known in the art from DE 39 07 927 A1.

NMR tomography systems have their main medical application in the area of whole body tomography for non-invasive investigations of patients. Towards this end, on the one hand, when configuring the system, one must take care that the homogeneity of the static magnetic field is as high as possible so that a high resolution of the slice images created can be achieved and, on the other hand, the treating physician should have ample spatial access to the patient being examined so that, for example, a concurrent treatment of the patient simultaneously with slice image generation is facilitated. Furthermore for the purpose of preventing claustrophobia on the part of the patient, it is desirable when the structure of a whole body tomograph of this kind is as "open" as possible.

An electromagnetic system for nuclear spin tomography is described in DE 36 16 078 C2 with which a resistive H-magnet with suitable pole shoes is utilized. Although this system known in the art allows the possibility of transverse access to the investigational volume, there is however, no free axial access thereto. Due to the massive pole shoes there are, in general, significant eddy current problems. The homogeneous magnetic field is largely produced not by the geometry of the coils rather through the shape of the pole shoes which significantly limits the variational possibilities in the configuration of the magnet fields. In contrast to the so-called "air coil configurations", to which the above cited magnet system according to DE 39 07 927 A1 belongs, the pole shoe electromagnetic systems in accordance with DE 36 16 078 C2 are a completely different magnet type which exhibits completely different problems associated with its characteristics.

A magnetic coil configuration is known in the art from EP 0 011 335 B1 which belongs to the "aircoil" magnet type. Here one is dealing with a double Helmholtz configuration having at least four individual current guiding coils with which the currents flow during operation in parallel through the coils. This configuration known in the art allows only an extremely narrow gap for sideward access due to the geometry of the magnet coils which can, for practical purposes, not be utilized by a therapist.

In the coil configuration known in the art from DE 32 45 944 C2 one is likewise dealing with a double Helmholtz configuration having at least four individual current carrying coils with which the currents flow in parallel through the coils during operation. This configuration, which is known in the art does not, however, allow for a transverse access due to the iron shielding provided thereby, since the shielding is completely closed. Even if the iron shielding were eliminated, only a theoretical transverse access similar to the configuration in accordance with the above mentioned EP 0 011 335 B1 is possible.

In contrast thereto the above cited DE 39 07 927 A1 describes an air coil system having a double Helmholtz configuration with which the four partial coils provided for are fed with oppositely directed currents to facilitate a substantially larger separation between the coil pairs in the axial direction so that a relatively large transverse access to the investigational volume from the side is given. This configuration would facilitate a direct treatment of the patient being examined on the part of a therapist, in particular an operator, during which time the effectiveness of the treatment can be monitored through the simultaneous transfer of the recorded tomograms to a monitor at a visible distance from the therapist. A disadvantage of the magnet system according to DE 39 07 927 A1 is, however, that the coil configuration is relatively complex and that significantly higher ampere current numbers are necessary, due to the oppositely directed current feed of the coils for the production of the magnetic field, compared to the above mentioned double Helmholtz configuration having parallel current feed as is, for example, known in the art from EP 0 011 335 B1 or DE 32 45 944 C2. In particular, with resistive magnet coils, significantly higher electrical power is thereby necessary for producing the magnetic field.

U.S. Pat. No. 4,710,741 discloses a coil arrangement for producing a magnetic field of high homogeneity comprising a single pair of identical annular coils arranged coaxially in spaced relationship as well as a pair of ferromagnetic rings disposed coaxially to the coils, and symmetrically with respect to a plane perpendicularly intersecting the axis of the coils, half-way between them. The coils and ferromagnetic rings are dimensioned and positioned to eliminate the more significant spherical harmonic coefficients with the coils being powered with equal energizing currents.

GB 2219406A discloses an electromagnet having an x and y axis. A first and a second coil, having a plurality of windings, are arranged on opposite sides of the y axis as are a first and a second ferromagnetic ring. The first and the second coils and the first and the second rings are axially spaced apart along the direction of the x axis and are symmetrically arranged relative to the x and y axes. A cylindrical region for containing a shaped magnetic field (e.g. substantially spheroidal or substantially ellipsoidal) produced by means of the coils and rings is located within the electromagnet, the field having a predetermined amount of homogeneity in the cylindrical region.

In view of the above prior art, it is the purpose of the present invention to present a magnet system of the above mentioned kind with which a particularly good transverse access to the investigational volume is facilitated, whereby the coil configuration is simplified compared to the configuration known in the art, and a reduced ampere winding number for the production of a homogeneous magnetic field of the same field strength is required or reduced electrical power and thereby reduced requirements for the cooling of the configuration.

SUMMARY OF THE INVENTION

This purpose is achieved in accordance with the invention in that a ferromagnetic ring (R11 and R21) is provided for on each of the two magnet coils (S1, S2) which is arranged closer to the center of the investigational volume than the corresponding neighboring magnet coil (S1 or S2), whereby the following relationship is valid for the z positions $z_{R11}$ and $z_{R21}$ of the rings (R11 and R21):

$$0.6|z_{S1}|<|z_{R11}|<|z_{S1}| \text{ and } 0.6|z_{S2}|<|z_{R21}|<|z_{S2}|,$$

and whereby the following relationship is valid for the average separation $r_{R11}$ and $r_{R21}$ of the rings (R11 and R21) from the z axis:

$$0.6\ r_{S1}<r_{R11}<r_{S1} \text{ and } 0.6\ r_{S2}<r_{R21}<r_{S2},$$

and the rings (R11, R21) are positioned and dimensioned in such a fashion that the magnetic field in the center of the investigational volume can be rendered homogeneous up to 8th order with operational currents through the magnet coils (S1, S2), whereby the axial separation $g_S$ of both magnetic coils (S1, S2) assumes a value between ¼ and ¾, preferentially ½ of the sum $r_{S1}$ and $r_{S2}$ of the average separations of both magnetic coils (S1, S2) from the z axis, and the axial separation $g_R$ of both rings (R11, R21) is slightly, e.g. up to 15%, smaller than the axial separation $g_S$ between both magnet coils (S1, S2) and the rings (R11, R21) are at least partially integrated into the coils.

The average separation $r_{S1}$, $r_{S2}$ of the coils S1, S2 from the z axis or the average separation $r_{R11}$, $r_{R21}$ of the rings R11, R21 from the z axis is determined, in each case, by the center of gravity of the corresponding cross sectional surface of the coils or rings in a half plane extending from the z axis. The same is true for the determination of the corresponding average z positions $z_{S1}$, $z_{S2}$, $z_{R11}$, $z_{R21}$.

In the magnet system in accordance with the invention, in contrast to the configuration in accordance with DE 39 07 927 A1, only two current guiding coils, which can be fed in the same direction, are necessary. In this fashion an optimal utilization of the electrical power or of the ampere winding number utilized for field production is guaranteed. The additional required coils of the known configuration are replaced as it were in the configuration in accordance with the invention by the two ferromagnetic rings. In this fashion the amount of relatively expensive coil material (copper and corresponding alloys) is reduced. Due to the special geometry of the configuration in accordance with the invention a relatively large transverse access to the investigational volume thereby obtains.

A particularly large transverse access to the investigational volume is obtained in the magnet system in accordance with the invention when the axial separation $g_S$ of the two magnet coils (S1, S2) assumes a value between ¼ and ¾, preferentially ½ of the sum $r_{S1}$ and $r_{S2}$ of the average separations of the two magnet coils (S1, S2) from the z axis, whereby the axial separation $g_R$ of both rings (R11, R21) is slightly, e.g. up to 15%, smaller than the axial separation $g_S$ of both magnet coils (S1, S2).

The magnet coils (S1, S2) in accordance with the invention are wound onto coil supports and the rings (R11, R21) are at least partially integrated into the coils. In this fashion it is possible for the coil supports to be partially or completely fashioned from ferromagnetic material and to satisfy the above defined geometric conditions for the two rings (R11, R21).

An embodiment of the invention is particularly preferred with which an iron shielding is provided for around the magnet system. In this fashion it is possible, on the one hand, for the stray field of the magnet to be outwardly shielded and, on the other hand, to shield the investigational volume, in which the produced magnetic field must be particularly homogeneous, against outer disturbing fields. Furthermore, an iron shielding serves the purpose of producing an increased field strength in the investigational volume for equal currents through the magnet coil, in particular when it is at least partially axially opened.

An advantageous improvement in this embodiment provides that the iron shielding have a ring-shaped gap providing a passageway in the central region about the z axis so that, in addition to a transverse access, an increased axial access is facilitated.

The shielding can, in particular, be configured in the form of two half-shells so that there is no closed magnetic yoke. Due to the development of forces during operation of the magnetic coil it is, however, necessary to provide for a spacer which, however, need not be ferromagnetic. The ferromagnetic shielding facilitates a particularly good transverse access with full rotational symmetry due to the ring-shaped gap passage at the central region, whereby the rotational symmetry permits of a particularly high field homogeneity in the investigational volume.

A further embodiment of the magnet system in accordance with the invention has a Faraday-shielding for high frequency fields which is at least partially integrated into the iron shielding in order to keep the entire configuration as compact as possible.

An embodiment is particularly preferred in which the ferromagnetic rings (R11, R21) are permanent magnets. In this fashion the same field strength can be produced in the investigational region as with non-completely saturated soft magnetic rings but with smaller ring cross sectional areas.

It is preferred when the rings, and if applicable, the shielding have as small an electrical conductivity as possible in order to curtail the built-up of eddy currents when switching magnetic field gradients and the thereby associated disturbances in the field homogeneity.

In a particular improvement in this embodiment the rings and, if applicable, the shielding is slotted, laminated or, for example, pressed from a powdered material.

In a symmetric and therefore particularly easily produced embodiment, the ferromagnetic rings of the magnet system in accordance with the invention are circular rings. Thereby, as high a homogeneity of the static magnetic field as possible is achieved in the investigational volume.

For example, for mammography applications when both breasts are to be simultaneously investigated, a particularly appropriate embodiment provides that the ferromagnetic rings and the main coils have an elliptical or approximately rectangular shape.

It is particularly advantageous for the innovations in accordance with the invention to be utilized with resistive magnet coils. In comparison to the above cited systems which are known in the art, by way of example the configuration according to DE 38 07 929 A1, the system in accordance with the invention requires significantly lower electrical power for the production of a homogeneous magnetic field of comparable field strength. The magnet system in accordance with the invention can, however, also contain superconducting magnet coils, whereby the coils can then be smaller than the configuration known in the art due to the reduced ampere winding number required for comparable magnetic field strength.

It is preferred when the strength of the homogeneous magnetic field which is produced assumes a value of approximately 0.1 Tesla to 0.4 Tesla (corresponding to a proton frequency between 5 MHz to 15 MHz). In this field strength region the power savings, in particular when utilizing resistive magnet coils, is particularly high.

An embodiment of the magnet system in accordance with the invention is particularly preferred with which a magnetic field homogeneity<$10^{-4}$ can be achieved in an investigational volume having a diameter>0.3 m so that sufficiently high resolution slice images of the measuring object or of the patient being investigated can be produced in a particularly large investigational region.

It is preferred when the z axis of the magnet system in accordance with the invention runs horizontally so that the patient being investigated in a whole body tomograph can lie prone, while the investigation therapist or operator can stand or sit.

In a particularly preferred embodiment of the invention the magnet system further comprises a second ring pair (R12, R22) coaxial to both magnet coils (S1, S2) with the z positions $z_{R11}$, $z_{R12}$, $z_{R21}$, $z_{R22}$ of the rings (R11, R12, R21, R22) being in relation $$|z_{Rij}|<|z_{Si}| \text{ and } |r_{Rij}|<|r_{Si}| \text{ with } i,j=1,2,$$

wherein the rings $R_{ij}$ are positioned and dimensioned in such a fashion that the magnetic field in the center of the investigational volume at operational current through the coils (S1, S2) is homogeneous to at least 10th order.

The average separation $r_{Si}$ of the coils $S_i$ from the z axis or the average separation $r_{ij}$ of the rings $R_{ij}$ from the z axis is, in each case, determined by the center of gravity of the corresponding cross sectional area of the coils or rings in a half-plane extending from the z axis. Corresponding conditions reign for the determination of each average z position $z_{Si}$, $z_{Rij}$.

It is preferred when the following relationship obtains for the outer rings:

$$0.6|z_{Si}|<|z_{Ri1}|<| \text{ and } 0.6|r_{Si}|<|r_{Ri1}|<|r_{Si}|i=1,2$$

and for the inner rings:

$$|z_{Ri2}|<|z_{Ri1}| \text{ and } 0.6|r_{Si}|<|r_{Ri2}|<|r_{Si}|<|i=1,2.$$

The magnet system in accordance with the invention can include more than four ferromagnetic rings as a result of which the field homogeneity is increased even further. One should thereby note that the field in the center is thereby strengthened for relatively large z values of the rings and weakened for smaller z values. Permanent magnetic rings can, however, be magnitized in opposite directions so that these, in principle, could also contribute a positive magnitude at the center for small z values.

Although two magnet coils are sufficient in this embodiment of the magnet system in accordance with the invention these coils could be complemented by additional codirectionally or antidirectionally wound coils which could be effected through a largely formal splitting of one coil into two partial coils or through the addition of oppositely directed coils with very small ampere winding numbers for marginal further improvement of the homogeneity, whereby the main contribution to the field still comes from the two main coils and the magnetized ferromagnetic rings.

Through the use of ferromagnetic rings, the magnet system can be, preferentially, quite short. It would, in a whole body system, be possible to have construction lengths of less than 1.2 m, in fact, of less than 1.05 m and, in extreme cases when one is willing to accept a small ripple in the homogeneous volume, to achieve values of 0.85 m. This represents an enormous improvement relative to prior art. Installation problems are reduced, claustrophobia avoided, and axial access improved.

Through the effective utilization of the ferromagnetic rings, it is possible for the entire weight of preferred embodiments, even including an integrated iron shielding, to be kept small, by way of example, less than 55000N or in fact less than 32000N which clearly reduces transport and installation problems.

In particular, the weight of the magnet coils can be reduced in an advantageous fashion due to the fact that a substantial contribution to the field comes from the ferromagnetic rings and the configuration is, in general, more effective. Preferably, the weight of the magnet coil wires is less than 21000N and, in a particularly preferred embodiment, less than 13000N.

In an extremely compact system it is possible, when sacrificing a slight amount of homogeneity and free access, to, in fact, achieve a coil weight of less than 8000N and an overall weight of less than 22000N.

With resistive systems, not only the material costs but also the power consumption and cooling problems are reduced. With superconducting coils, expensive superconducting wire is economized and cryostat construction is simplified by the lighter and more compact coils. Preferably, with superconducting coils, at least a part of the ferromagnetic rings is located within a cryostat at low temperature.

It is preferred when an axial access of at least 0.5 m or at least 0.6 m obtains, e.g. the inner diameters of the coils and rings therefore being larger than this value. In this fashion, in certain applications, insertion of the patient is still possible.

In embodiments having partially interrupted or completely absent iron shielding there is, in an advantageous fashion, a transverse access between the ferromagnetic rings, e.g. the outer rings $R_{i1}$ have a separation of at least 0.4 and preferentially 0.5 m and the two inner rings $R_{i2}$ one of at least 0.2 m, preferentially 0.24 m. In this fashion it is possible for a patient to be observed or therapy measures exercised upon him during the investigation or the access can be used for feed tubes. In addition the danger of claustrophobia is reduced in that the patient can look towards the outside (in the event of which partially transparent gradients and RF systems are necessary).

Further advantages of the invention are given in the description and the accompanying drawing. The above mentioned features and those to be further described below in accordance with the invention can be utilized individually or collectively in arbitrary combination. The embodiments shown and described are not to be considered as exhaustive enumeration, rather have exemplary character only.

The invention is represented in the drawing and will be more closely described and explained with reference to concrete embodiments.

DESCRIPTION OF THE PREFERRED EMBODIMENT

Figure 1:
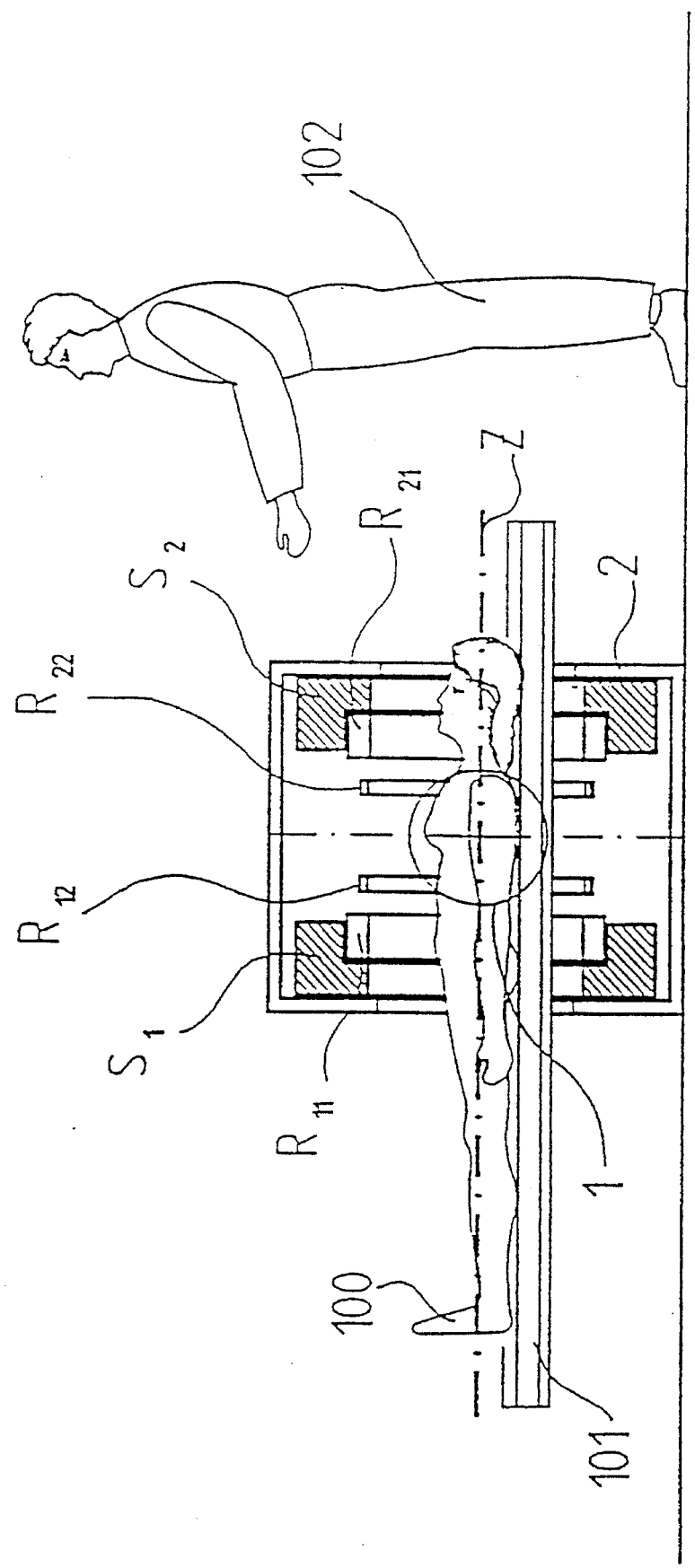
FIG. 1 shows a longitudinal cut containing the z axis through a schematic magnet system in accordance with the invention.

The magnet coil system represented in FIG. 1 in accordance with the invention for use in nuclear magnetic resonance tomography (NMR) exhibits magnet coils S1, S2 arranged on both sides of an investigational volume 1 coaxial to a z axis which have direct current flowing through them in the same direction during operation. Two ferromagnetic rings R11, R12 and R21, R22 respectively are provided, in each case, coaxial to both magnetic coils S1, S2 which are closer to the center of the investigational volume 1 than their associated neighboring magnet coil. The rings R11, R12 and R21, R22 respectively are positioned and dimensioned in such a fashion that the magnetic field at the center of the investigational volume 1 is rendered homogeneous up to 12th order by current flowing through the magnet coils S1, S2.

The system shown in FIG. 1 is realized with a field strength of 0.2 Tesla and a power value for the resistive, water-cooled magnet coils S1 and S2 of 38 kW. The investigational region 1, having a homogeneity of the produced magnetic field of<$10^{-4}$, has a diameter of 320 mm. The weight of the apparatus assumes a value of 31000N, the length only 1.00 m, and the diameter 1.28 m. The axial access has an opening of 0.55 m. Transverse access of 50 cm remains between the ferromagnetic rings $R_{i1}$ and of 24 cm between the rings $R_{i2}$. The copper coils have a total weight of 12000N.

The outer rings $R_{i1}$ are partially integrated into the coil supports. They can also be separate, whereby the coils can then radially lie completely outside of the rings and their rectangular cross section can be maintained.

The system is surrounded by an integrated iron shielding 2 which can, in principle, also be eliminated (with appropriate adjustment of the coil and ring geometries or positions). The iron shielding 2 must not extend completely rotationally symmetrically about the magnetic axis z, rather can, in general, be interrupted in a symmetric fashion at the central region in order to create a transverse access between the rings. In extreme cases it is even possible for one or more complete ring gaps to be left open which are only bridged by non-magnetic supports or for the shield 2 to be completely eliminated. In order to illustrate the size relationships, a patient 100 on a patient bed 101 as well as a therapist 102 are drawn in FIG. 1.

A main application of the magnet coils system in accordance with the invention is whole body tomography and, in particular, also mammography.

Table 1 gives examples of three embodiments of the invention in comparison to each other. They all have the same fundamental construction as well as the same magnetic field strength in the homogeneity volume but differ however in detail and are adapted for somewhat differing applications. The table is intended only to show the fundamental variability of the concept. The invention is,

TABLE 1

| | CIMS B = 0.2T | | |
|---|---|---|---|
| | CIMS A | CIMS B | CIMS C |
| Number of coils | 2 | 2 | 2 |
| Order | 12 | 12 | 12 |
| $D_1$ Coil | 650 mm | 760 mm | 550 mm |
| Homogeneity 20 ppm | 320 mm | 380 mm | 270 mm |
| Length | 1000 mm | 1200 mm | 850 mm |
| Diameter | 1280 mm | 1480 mm | 1080 mm |
| Weight Cu | 12 000 N | 20 000 N | 7 200 N |
| Fe weight | 21 000 N | 30 000 N | 13 000 N |
| Total weight | 31 000 N | 50 000 N | 21 000 N |
| Power | 38 KW | 44 KW | 30 KW |
| Access | | | |
| axial | 550 mm | 600 mm | 500 mm |
| transverse | (240 mm/ 500 mm) | (280 mm/560 mm) | (220 mm/ 420 mm) | however, by no means restricted to the confines of these examples. Towards this end, as mentioned, the iron shielding can be eliminated or the field strength can be somewhat higher, in particular, with superconducting variations.

Figure 2:
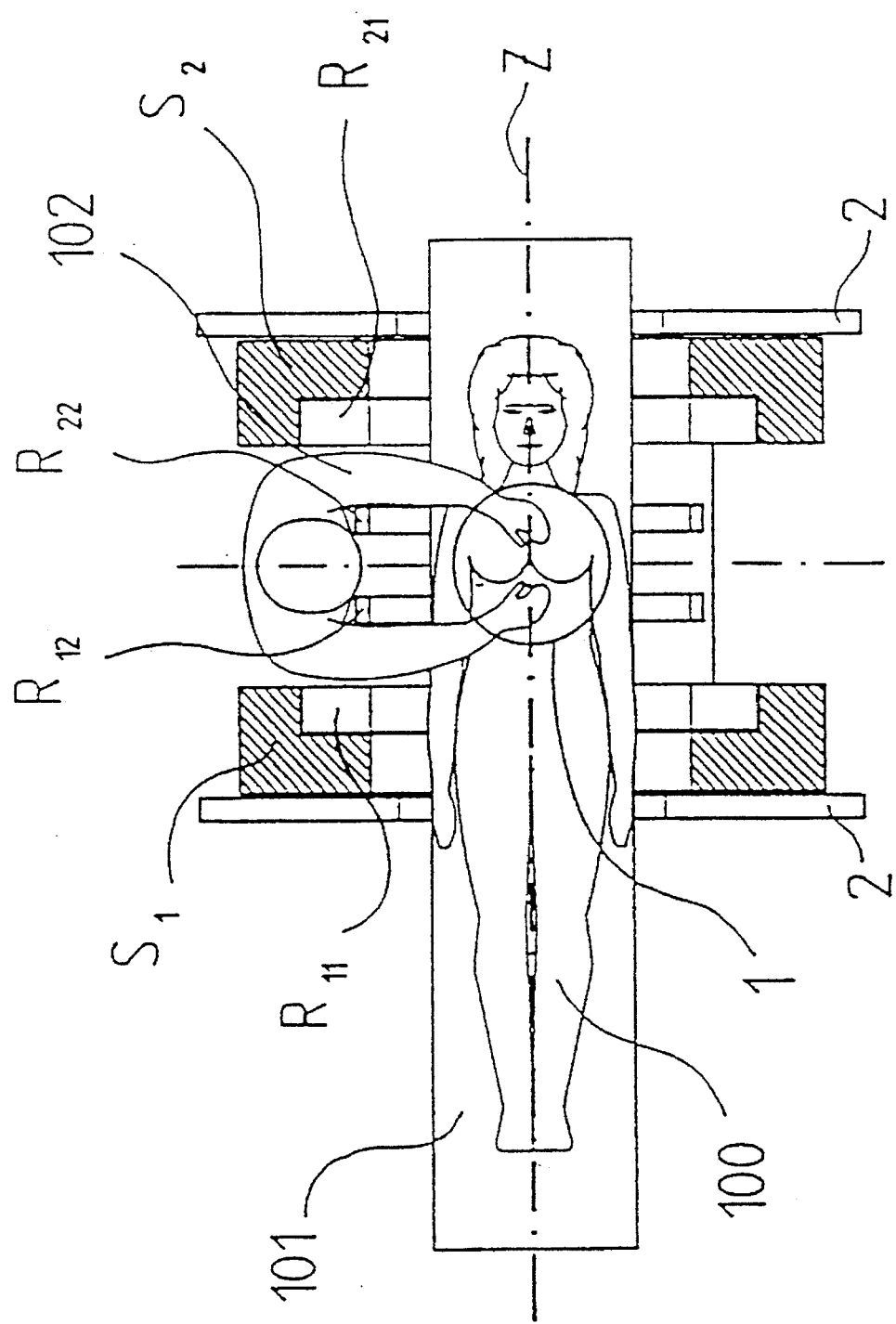
FIG. 2 shows a schematic longitudinal cut containing the z axis through an embodiment of the magnet system in accordance with the invention having the possibility of transverse access.

FIG. 2 illustrates the possible transverse access. Reference symbols correspond to those in FIG. 1. The iron shielding 2 is interrupted in the vicinity of the transverse access. This can, however must not, be the case over the entire periphery.

Figure 3:
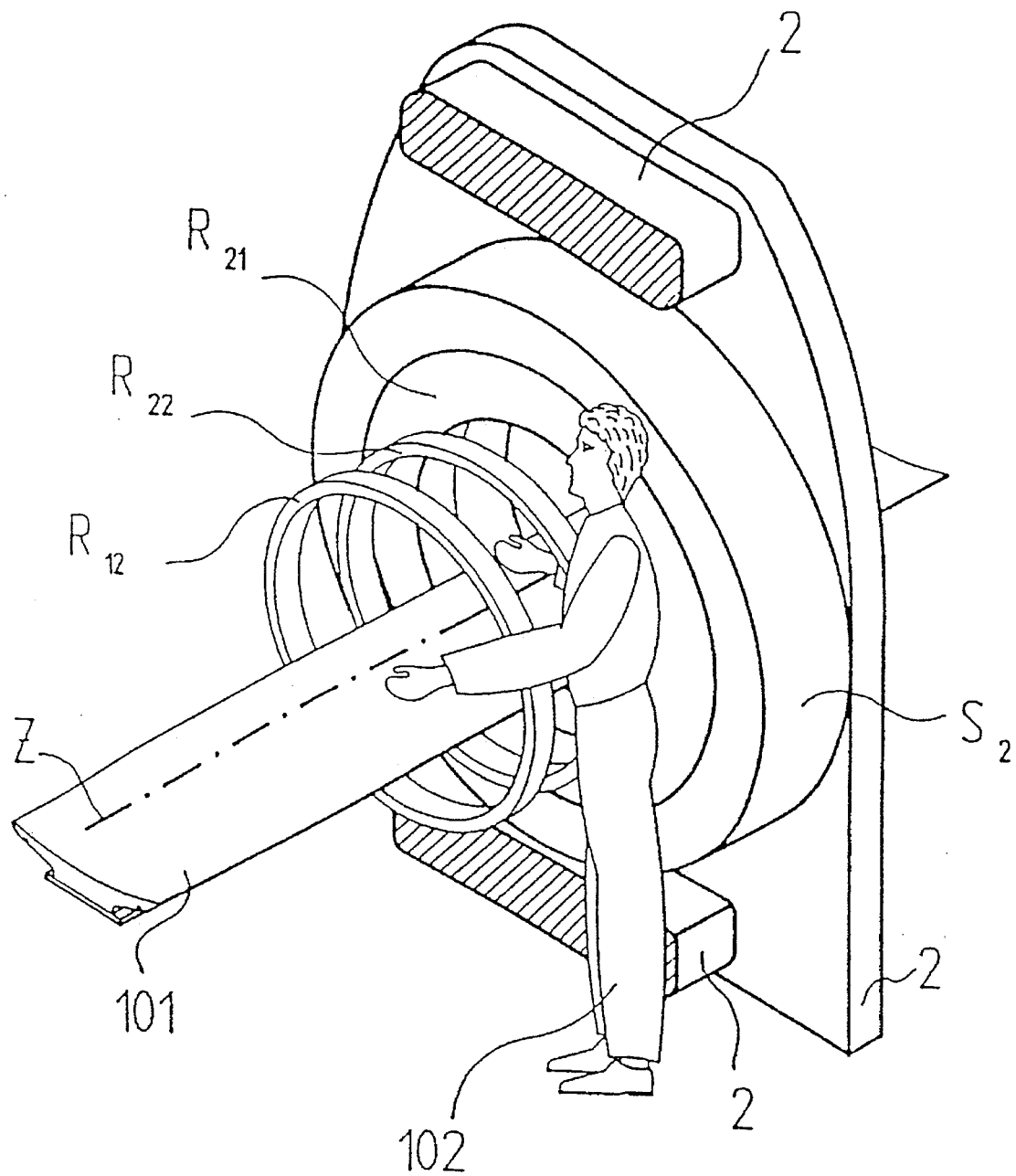
FIG. 3 shows a perspective representation having a yoke which facilitates transverse access.

FIG. 3 shows an opened-up perspective view of a magnet having a shielding 2 in the form of a yoke which facilitates a particularly good transverse access to the patient. The yoke 2 exhibits a double rotational symmetry with respect to the z axis.

Figure 4:
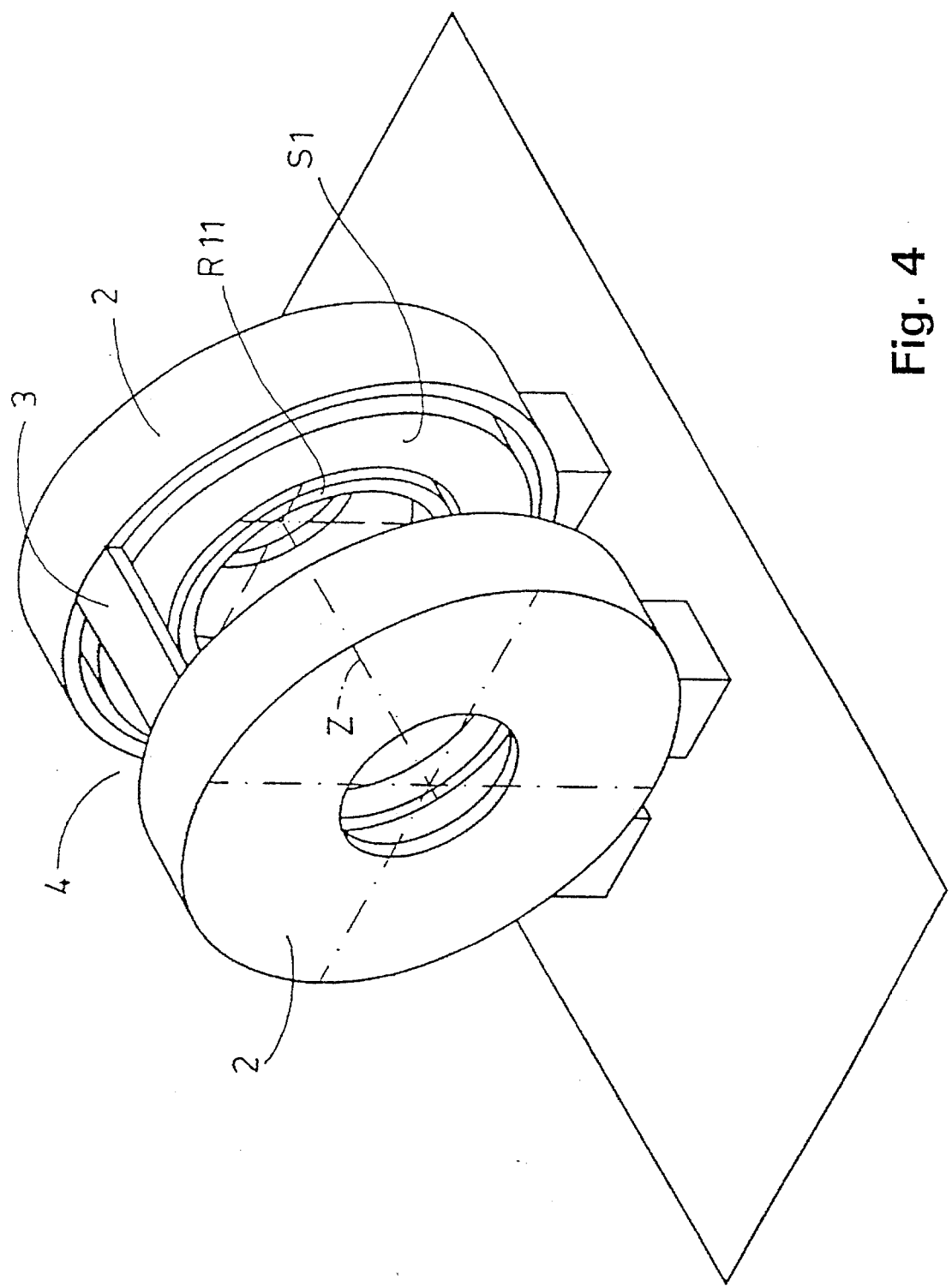
FIG. 4 shows a schematic perspective representation of the magnet system in accordance with the invention having two half-shell shielding elements.

FIG. 4 shows an iron shielding 2 of this kind in the form of a half-shell. A non-ferromagnetic spacer 3 separates the two halves of the iron shielding from another; in a central region the iron shielding exhibits a ring-shaped gap 4 providing a passageway which facilitates transverse access at full rotational symmetry of the ferromagnetic shielding as a result of which the high homogeneity of the magnetic field produced in the investigational volume is maintained.

In a C-shaped configuration of the iron yoke which is not shown, a more even distribution of the magnetic flux over the coil cross section can be achieved by means of a suitable air gap (Purcell gap).

Table 2 shows the relevant data for 2 calculated

TABLE 2

Figure 5:
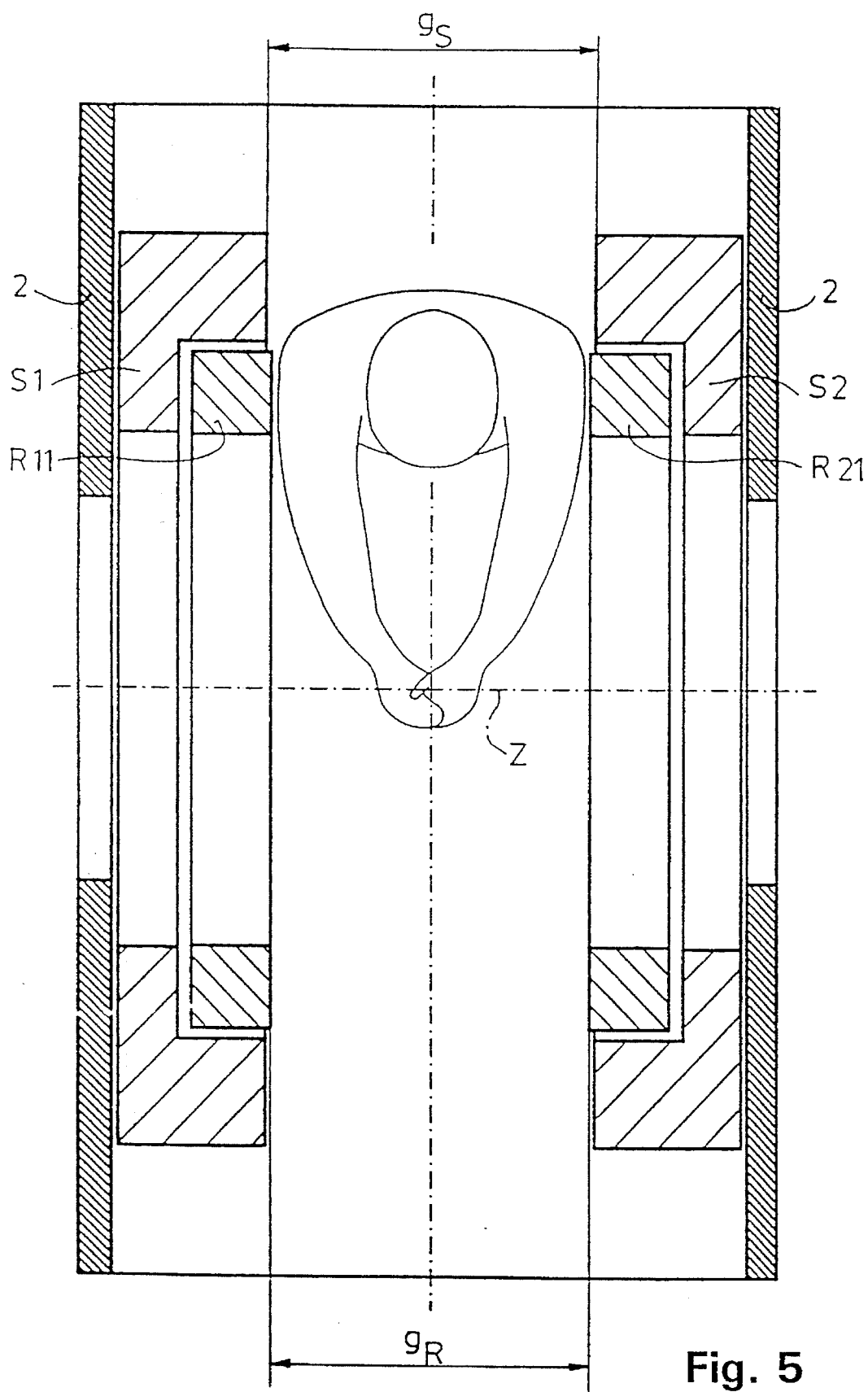
FIG. 5 shows an embodiment of the magnet system in accordance with the invention in a cut horizontal view with the horizontal cut plane containing the z axis and an operator being schematically shown from above.
Figure 6:
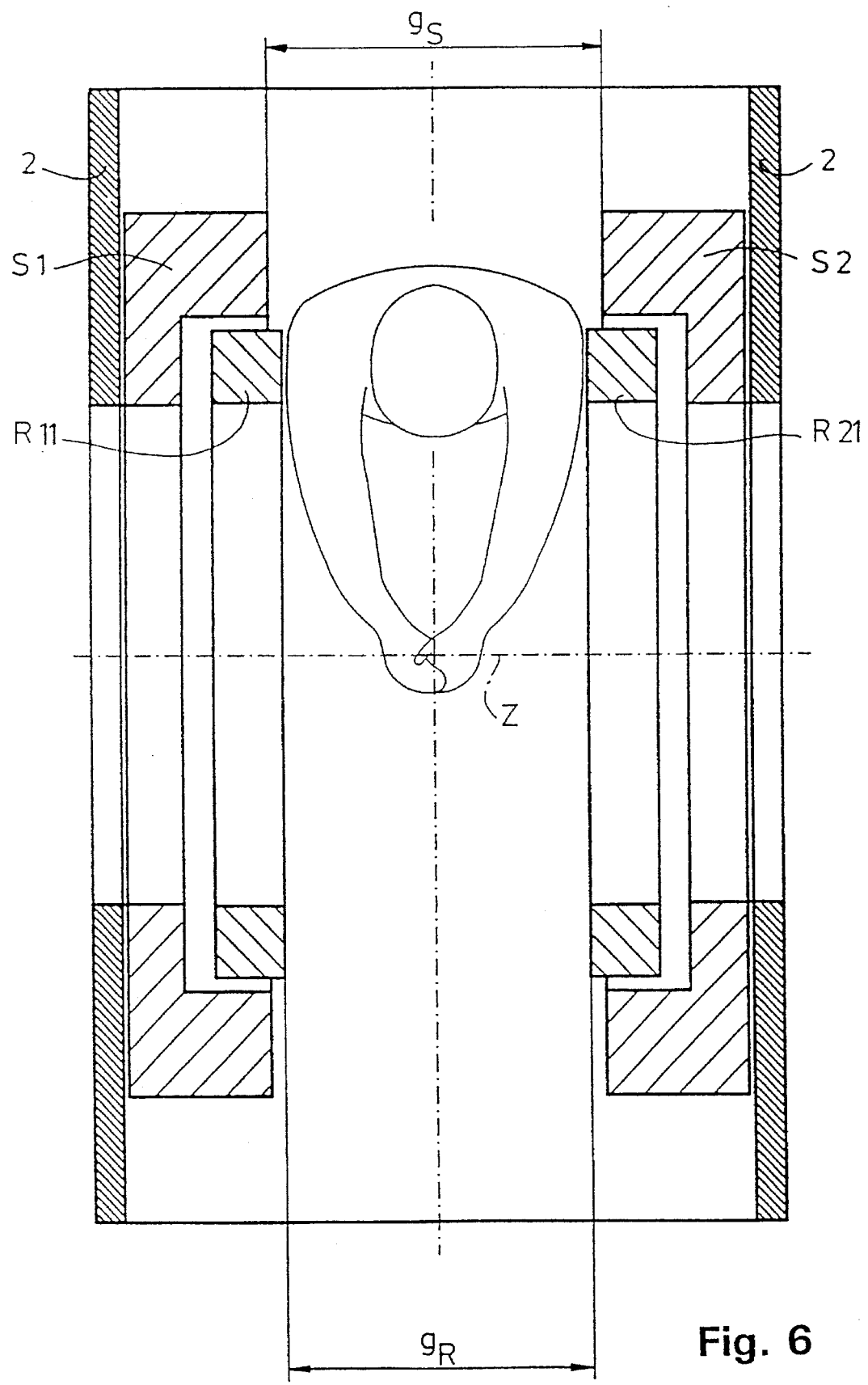
FIG. 6 shows an embodiment of the magnet system in accordance with the invention in a cut horizontal view with the horizontal cut plane containing the z axis and an operator being schematically shown from above.

| AIMS Version Free access | FIG. 5 INTA | FIG. 6 INTB |
|---|---|---|
| Ring, radial | 500 mm | 490 mm |
| Ring, axial | 800 mm | 800 mm |
| Coil, radial | 510 mm | 540 mm |
| Fe, axial | 600 mm | 800 mm |
| Field | 0.2T | 0.2T |
| Power | 37.4 KW | 46.8 KW |

TABLE 2-continued

| AIMS Version Free access | FIG. 5 INTA | FIG. 6 INTB |
|---|---|---|
| Weight (Cu) | 22.400 N | 22.400 N |
| Total weight | 70.000 N | 70.000 N |
| homogeneity dsv 20 ppm | 275 mm | 275 mm | embodiments of the magnet system in accordance with the invention which are represented in FIGS. 5 and 6 in horizontal cut.

In the variation INT A shown in FIG. 5 the rings R11, R21 are completely integrated into the magnet coils S1, S2. This variation is particularly simple to produce and provides a sufficiently large axial access.

The variation INT B shown in FIG. 6 also allows for a particularly large axial access to the investigational region. This can, for example, be advantageous for an optimized gradient system. However, the power requirements increase notably over the variation INT A. The coil separation in the axial direction is likewise smaller than the previously described embodiment.

Figure 7:
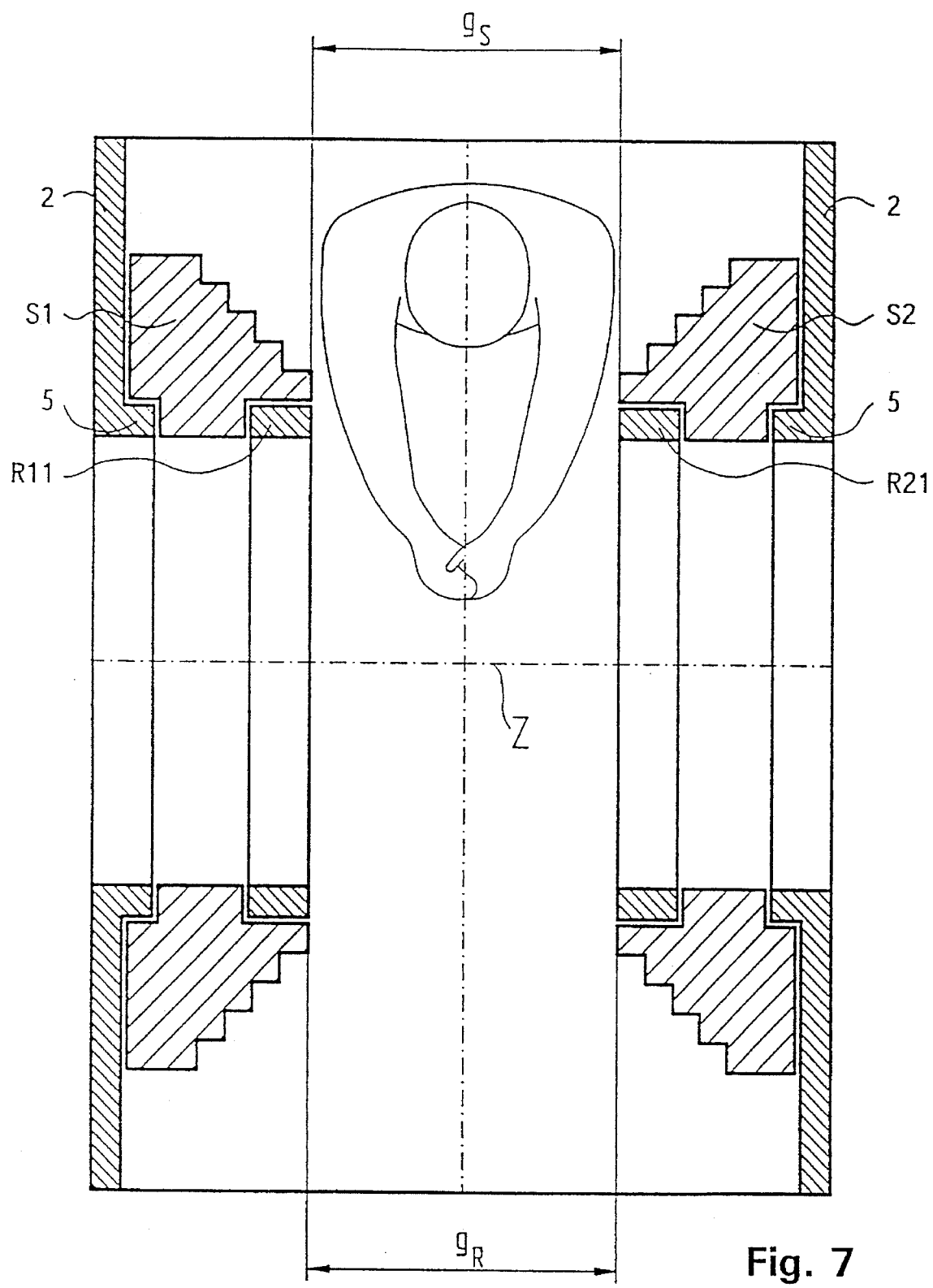
FIG. 7 shows an embodiment of the magnet system in accordance with the invention in a cut horizontal view with the horizontal cut plane containing the z axis and an operator being schematically shown from above.

The variation shown in FIG. 7 includes step-shaped enlarged coils S1 and S2. This embodiment is particularly well suited for small field strengths (for example for a proton frequency of 6 MHz). By means of the step-like configuration of the coils S1 and S2, the transverse access in increased whereby, in addition, good axial access to the investigational volume obtains. The entire weight of this embodiment as well as the mass of copper utilized is particularly low. This embodiment of FIG. 7 exhibits a particularly high axial access to the investigational region characterized by an inwardly cropped-off "toe" 5 in the shielding 2. A particularly wide and continuous free region of constant diameter results in the axial direction.

The embodiment of FIG. 7 also distinguishes itself in that the ferromagnetic rings R11, R21 are at least partially integrated into the magnet coils S1 and S2. The ferromagnetic rings R11, R21 can be partially slanted in the vicinity of the transverse access to further facilitate the transverse access of the operator to the investigational volume. The integration of the rings allows for the production of a compact unit and substanially simplifies manufacture of the system. Axial access to the investigational volume in this embodiment is sufficiently good and can be utilized up to proton frequencies of approximately 12 MHz.

Figure 8:
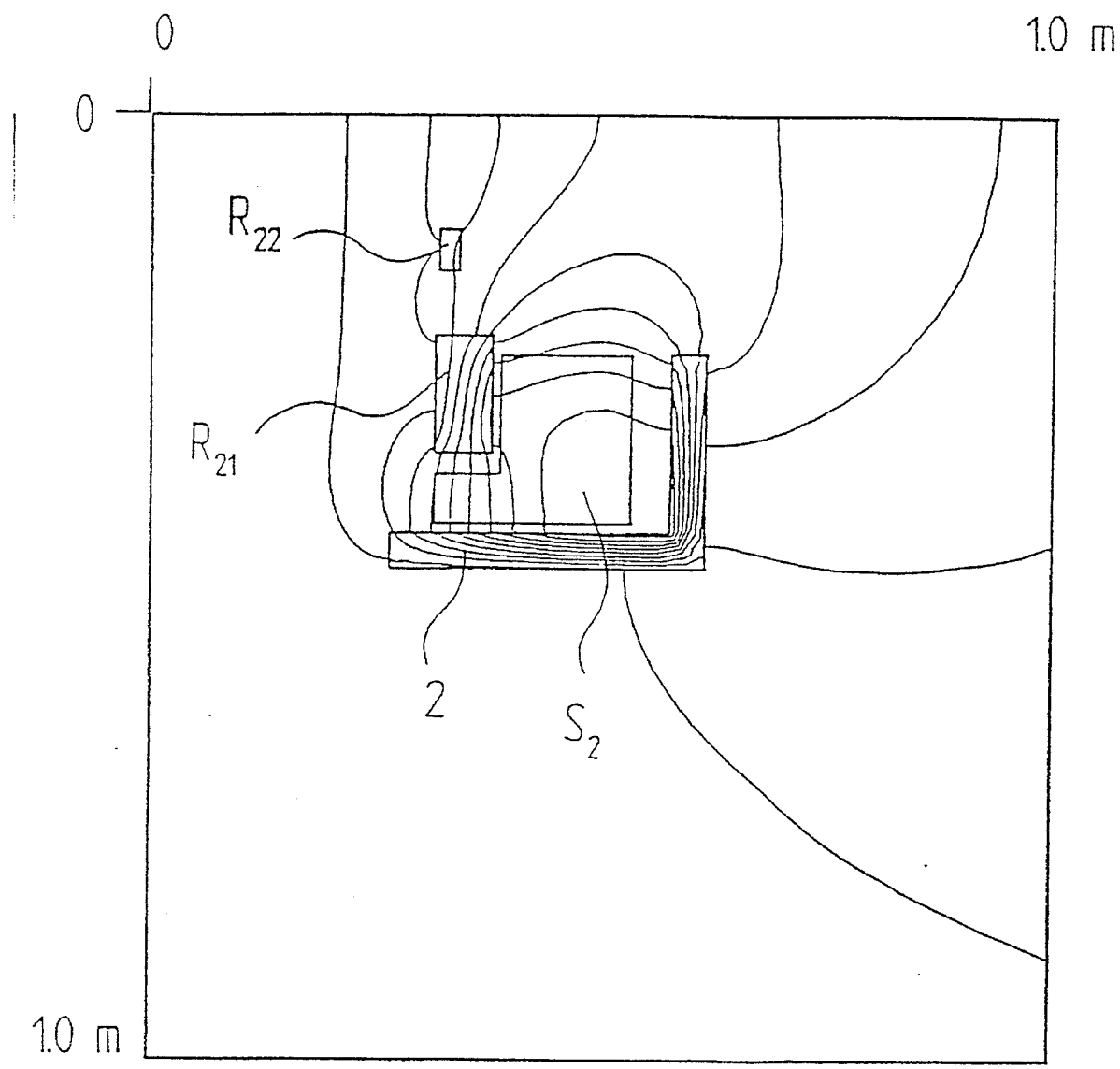
FIG. 8 shows a representation of the field lines in a quadrant with a ferromagnetic half-shell shielding.

FIG. 8 shows a quadrant of the coil ring configuration having a cut through the magnet coil S1 and the rings R11 and R12 as well as a shielding element 2. The dependence of the magnetic field lines for a half-shell ferromagnetic shielding 2, which is rotationally symmetric about the z axis and which opens a ring-shaped gap around the entire periphery at z=0, is shown.

Figure 9:
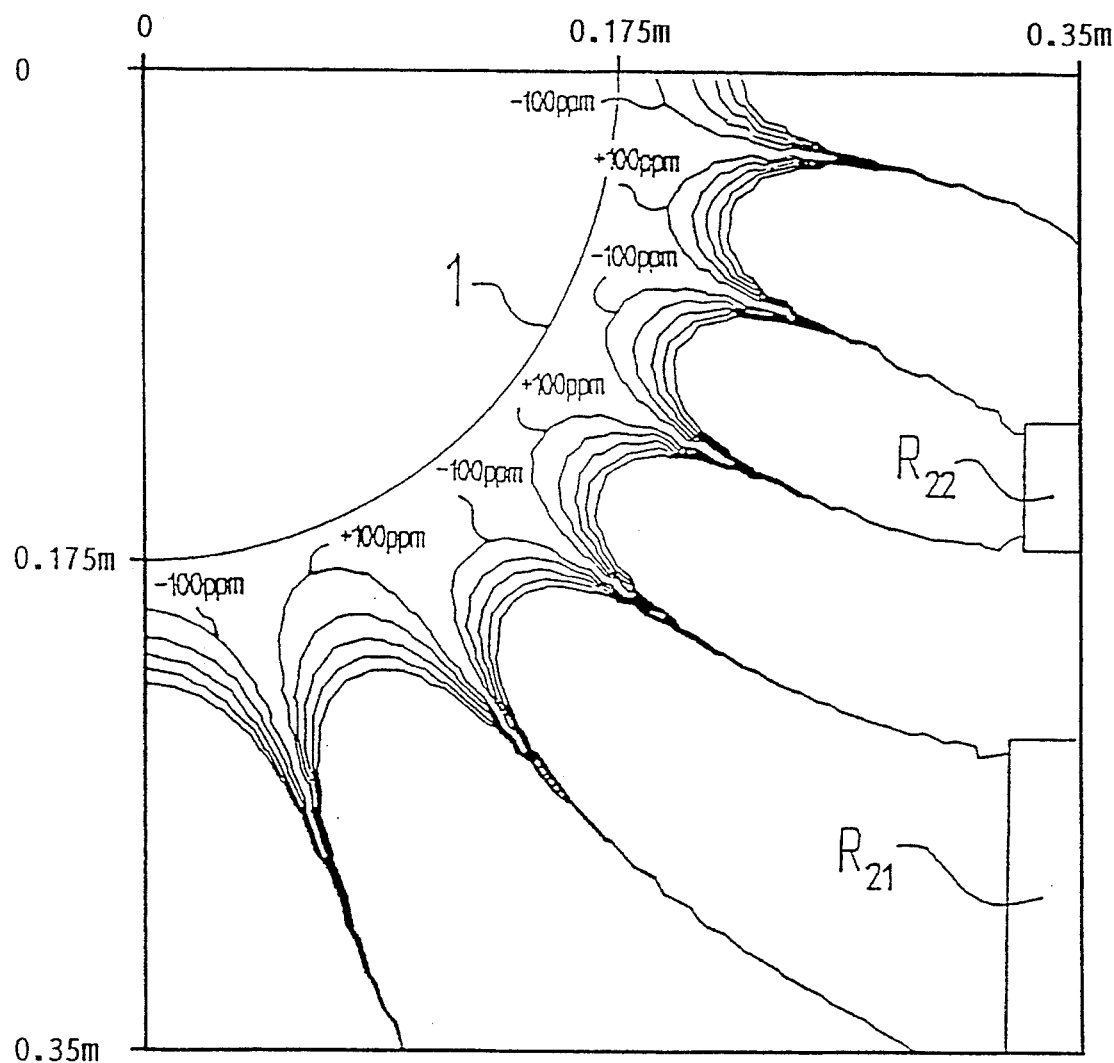
FIG. 9 shows a calculated diagram of the lines of equal field deviation±100 ppm of a magnetic field homogeneous to 12th order in a magnet configuration in accordance with the invention.

FIG. 9 shows one quadrant of a calculated diagram of the lines of equal field deviation (particularly emphasized are the lines with ±100 ppm deviation) in a plane perpendicular to the z axis, whereby the left upper corner of the picture coincides with the center of the investigational volume 1 in the apparatus. The side lengths of the calculated representation correspond in each case to 0.35 m. One sees, in FIG. 9, six "beams", which indicates a field homogeneity of 12th order for the system.

Deviations from a field homogeneity of 12th order can occur in given cases. However, the homogeneity should be close to that of the precise 12th order solution. With a so-called "overshoot" of the homogeneity it is, for example, possible to realize a system of 10th order which, however, nearly satisfies the homogeneity requirements of a system of 12th order. The advantages of such a system with "overshoot" lie in an increased homogeneity radius, and the disadvantage of slight field dependence ripple in the homogeneity region of the apparatus can be accepted. With relaxed boundary conditions it is also possible to change the positions of the rings in such a fashion that a substantially better transverse access is possible.

I claim:

1. A magnet system for magnetic resonance imaging of an investigational volume having a center at z=0, the system comprising:

a first magnet coil S1 coaxial to a z axis through the center and having an axial z position $z_{S1}$ from the center and a radial separation $r_{S1}$ from the z axis, the first magnet coil located on a first side of the investigational volume and having a first DC current;

a second magnet coil S2, coaxial to the z axis at an axial z position $z_{S2}$ from the center and a radial separation $r_{S2}$ from the z axis, the second magnet coil located on a second side of the investigational volume and having a second DC current, the first and second currents flowing in a common direction, and

¼;

a first ferromagnetic ring R11, partially integrated into the first magnet coil, coaxial to the z axis at an axial z position $|z_{R11}|<|z_{S1}|$ from the center and a radial separation $r_{R11}<r_{S1}$ from the z axis; and a second ferromagnetic ring R21, partially integrated into the second magnetic coil, coaxial to the z axis at an axial z position $|z_{R21}|<|z_{S2}|$ from the center and a radial separation $r_{R21}<r_{S2}$ from the z axis, and 0.85, wherein the first and second rings are positioned and dimensioned to produce a magnetic field in the investigational volume which is homogeneous up to 8th order.

2. The magnet system of claim 1, further comprising an iron shielding around the magnet system.

3. The magnet system of claim 2, wherein the iron shielding has a continuous ring-shaped gap directed around the z axis.

4. The magnet system of claim 2, further comprising a Faraday shielding at least partially integrated into the iron shielding.

5. The magnet system of claim 1, wherein the first and second rings are permanent magnets.

6. The magnet system of claim 1, wherein the first and second rings have a low electrical conductivity.

7. The magnet system of claim 6, wherein the first and second rings are at least one of slotted, laminated, and made from pressed powdered material.

8. The magnet system of claim 1, wherein the first and second rings are circular.

9. The magnet system of claim 1, wherein the first and second rings are elliptical.

10. The magnet system of claim 1, wherein the first and second magnet coils are resistive.

11. The magnet system of claim 1, wherein the first and second currents are adjusted to produce a homogeneous static magnetic field between 0.1 and 0.4 Tesla.

12. The magnet system of claim 1, wherein the system is adapted to produce a magnetic homogeneity<$10^{-4}$ within an investigational volume having a diameter>0.3 m.

13. The magnet system of claim 1, wherein the z axis is horizontal.

14. The magnet system of claim 1, wherein the system is adapted for operation at differing magnetic field strengths.

15. The magnet system of claim 1, further comprising:

a third ferromagnetic ring R12 coaxial to the z axis at an axial z position $Z_{R12}$ from the center and a radial separation $r_{R12}$ from the z axis; and a fourth ferromagnetic ring R22 coaxial to the z axis of at an axial z position $zR_{22}$ from the center and a radial separation $r_{R22}$ from the z axis, wherein $|z_{Rij}|<|z_{Si}|$ and $|r_{Rij}|<|r_{Si}|$ with i,j=1,2, wherein the first, second, third and fourth rings are positioned and dimensioned to produce a magnetic field in the investigational volume which is homogeneous up to at least 10th order.

16. The magnet system of claim 15, further comprising an iron shielding around the magnet system, and at least one additional ferromagnetic ring.

17. The magnet system of claim 15, wherein the system has an axial length of less than 1.2 m and further comprises an iron shielding around the magnet system.

18. The magnet system of claim 15, wherein the system has an entire weight of less than 32000N, available axial access having a diameter of at least 0.5 m, and further comprises an iron shielding around the magnet system.

19. The magnet system of claim 15, wherein the first and second magnet coils have a combined weight of less than 13000N, the system has axial access having a diameter of at lest 0.5 m, and further comprising an iron shielding around the magnet system.

20. The magnet system of claim 15, wherein a transverse access of at least 0.4 m is provided for between the first and second rings and a transverse access between the first and fourth rings of at least 0.2 m.

* * * * *

UNITED STATES PATENT AND TRADEMARK OFFICE
CERTIFICATE OF CORRECTION

PATENT NO. : 5,463,364

DATED : October 31, 1995

INVENTOR(S) : Wolfgang Muller

It is certified that error appears in the above-indentified patent and that said Letters Patent is hereby corrected as shown below:

In col. 10, line 27 the formula reading "¼" should read $$-\tfrac{1}{4}[\,|r_{s1}| + |r_{s2}|\,] \leq |z_{s1}| + |z_{s2}| \leq \tfrac{3}{4}[\,|r_{s1}| + |r_{s2}|\,] -.$$

In col. 10, line 38 the formula reading " 0.85" should read $$-0.85[\,|z_{s1}| + |z_{s2}|\,] \leq |z_{R11}| + |z_{R21}| \leq |z_{s1}| + |z_{s2}| -.$$

Signed and Sealed this

Twentieth Day of February, 1996

Attest:

BRUCE LEHMAN

*Attesting Officer*  *Commissioner of Patents and Trademarks*